(12) United States Patent
Yoshikawa et al.

(10) Patent No.: US 7,719,119 B2
(45) Date of Patent: May 18, 2010

(54) SEMICONDUCTOR DEVICE, ELECTRONIC APPARATUS COMPRISING THE SAME, AND METHOD FOR FABRICATION OF SUBSTRATE FOR SEMICONDUCTOR DEVICE USED THEREIN

(75) Inventors: Noriyuki Yoshikawa, Osaka (JP); Noboru Takeuchi, Kyoto (JP); Kenichi Itou, Osaka (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 212 days.

(21) Appl. No.: 11/584,518

(22) Filed: Oct. 23, 2006

(65) Prior Publication Data
US 2007/0170578 A1    Jul. 26, 2007

(30) Foreign Application Priority Data
Jan. 26, 2006    (JP)    ............... 2006-018003

(51) Int. Cl.
*H01L 23/48* (2006.01)
*H01L 23/52* (2006.01)
*H01L 29/40* (2006.01)

(52) U.S. Cl. ............... 257/779; 257/E23.021; 361/764; 174/262

(58) Field of Classification Search ............... 257/774, 257/779, E23.021; 174/262; 361/764, 743
See application file for complete search history.

(56) References Cited

U.S. PATENT DOCUMENTS 6,781,224 B2    8/2004    Yoneda et al.
6,883,231 B2 *   4/2005    Igarashi et al. ............... 29/840
2003/0160325 A1*  8/2003    Yoneda et al. ............... 257/758
2005/0224970 A1* 10/2005    Matsuki et al. ............... 257/737

FOREIGN PATENT DOCUMENTS

| CN | 1440073 | 9/2003 |
|----|---------|--------|
| JP | 4-87673 A | 7/1992 |
| JP | 05-327196 | 12/1993 |
| JP | 2005-032931 | 2/2005 |

OTHER PUBLICATIONS

Chinese Office Action, with English translation, issued in Chinese Patent Application No. 200610141644.8, mailed Jul. 3, 2009.

* cited by examiner

*Primary Examiner*—David A Zarneke
*Assistant Examiner*—Jenny L Wagner
(74) *Attorney, Agent, or Firm*—McDermott Will & Emery LLP (57) ABSTRACT

A semiconductor device has upper electrodes and external terminals which are protruding above the both surfaces of a substrate for semiconductor device and connected to each other by penetrating electrodes, a first insulating film covering at least a metal pattern except for the portions of the first insulating film corresponding to the upper electrodes, a second insulating film covering at least another metal pattern except for the portions of the second insulating film corresponding to the external terminals, and a semiconductor element connected to the upper electrodes and placed on the substrate for semiconductor device. The solder-connected surface of the external terminal is positioned to have a height larger than that of a surface of the second insulating film. The semiconductor element is placed on the first insulating film and covered, together with the upper electrodes, with a mold resin.

7 Claims, 8 Drawing Sheets

SEMICONDUCTOR DEVICE, ELECTRONIC APPARATUS COMPRISING THE SAME, AND METHOD FOR FABRICATION OF SUBSTRATE FOR SEMICONDUCTOR DEVICE USED THEREIN

CROSS REFERENCE TO RELATED APPLICATIONS

The teachings of Japanese Patent Application JP 2006-18003, filed Jan. 26, 2006, are entirely incorporated herein by reference, inclusive of the specification, drawings, and claims.

BACKGROUND OF THE INVENTION

The present invention relates to a semiconductor device on which a high-frequency circuit is mounted and to an electronic apparatus comprising a high-frequency mounting circuit board to which the semiconductor device is connected by soldering.

In recent years, higher-speed operation and increasing miniaturization have been required of electronic apparatuses in an information communication field and in an information processing field. As a representative of these apparatuses, a mobile telephone apparatus can be listed. To increase the operating speed of an apparatus comprising a high-frequency mounting circuit board, such as a mobile telephone apparatus, and reduce the size thereof, it is not only necessary to increase the operating speed of each of the high-frequency mounting circuit board and a semiconductor device in which a high-frequency circuit is mounted and reduce the size thereof but also necessary to improve a structure for mounting such as a package. In particular, the electrode structure of a package which is soldered to the mounting circuit board and the structure for mounting a semiconductor element, such as a package, are important.

Figure 7:
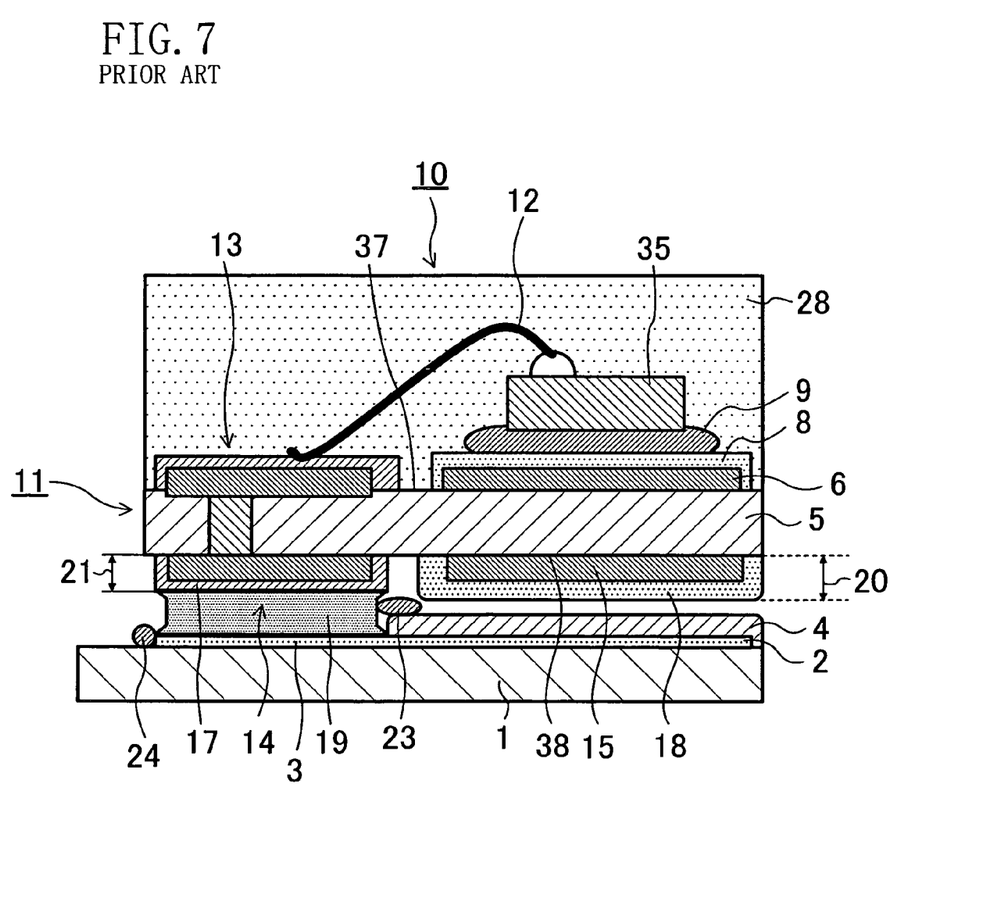
FIG. 7 is a schematic structural view showing a conventional semiconductor device and the state of the mounting thereof on a mounting circuit board.

FIG. 7 shows a schematic structure of mounting of a semiconductor device 10 on a mounting circuit board 1. The semiconductor device 10 comprises: a semiconductor element 35; a mold resin portion 28 which constitutes a package upper portion; and a package lower portion 11. The package lower portion 11 comprises: a substrate 5; metal patterns 6 and 15 formed on the first and second surfaces 37 of the substrate 5 (the upper and lower surfaces thereof in the drawing), respectively; and an upper electrode 13 and an external terminal 14 having different surface metal plate layers 8 and 17 formed on the respective surfaces thereof. On the surface metal plate layer 8 on the first surface of the substrate 5 for semiconductor device of the package lower portion 11, the semiconductor element 35 fixed by using an adhesive agent 9 is placed and electrically connected to the upper electrode 13 by a conductive wire 12.

On the second surface 38 of the substrate 5 for semiconductor device of the package lower portion 11, the external terminal 14 and a mounting land 3 on the mounting circuit board 1 are electrically connected by a solder connection portion 19. On the mounting circuit board 1 of FIG. 7, a wiring pattern 2 except for the portion thereof corresponding to the mounting land 3 connected to the semiconductor device 10 is covered with a solder resist 4 and insulated thereby. The metal pattern 15 on the second surface 38 of the package lower portion 11, except for the portion thereof corresponding to the external terminal 14, also has a surface thereof covered with a solder resist 18.

Each of the plate layers 8 and 17 is formed of, e.g., a Ni/Au double-layer plate. The purpose for plating the surface with the Ni/Au double-layer plate is to improve the connectivity of wire bonding and soldering.

When the semiconductor device 10 having a structure shown above is connected to the amounting circuit board 1, a height 20 of the solder resist 18 adjacent to the external terminal 14 of the package lower portion 11 from the second surface 38 of the substrate 5 is larger than a height 21 of the surface of the external terminal 14 from the second surface 38 of the substrate 5, as shown in FIG. 7. This is because the thickness of the Ni/Au layer (Ni: 3 to 6 μm, Au: 0.1 to 0.3 μm) as the surface metal plate layer 17 is sufficiently smaller than the thickness of the solder resist 18.

Because of the height difference, the external terminal 14 is away from the mounting land 3 so that the volume of the solder connection portion 19 is increased. When the amount of the solder is small, the amount of the solder filled in the increased volume becomes insufficient so that a solder skip occasionally occurs in the solder connection portion 19 to cause defective mounting. When the amount of the solder is large, the solder forms an extruded solder portion 23 between the solder resists 4 and 18, scatters, or causes a short-circuit (bridge) between the external terminals 14. There is also a case where a ball-shaped extruded solder portion 24 develops from the wiring pattern 2 on the mounting circuit board 1.

When the solder portions 23 and 24 extruded from the mounting land 3 on the mounting circuit board 1 and from the external terminal 14 in FIG. 7 become larger, they cause a short circuit between the different mounting lands 3 on the mounting circuit board 1 or between the external terminals 14, thereby preventing the normal operation of the semiconductor device 10 and the mounting circuit board 1. Even when the extruded portions are small, they cause a problem of degraded high-frequency characteristics such as an increased loss in electric signal in a high-frequency range exceeding 500 MHz or a higher level of noise which is mixed in an electric signal as a result of crosstalk to cause incorrect reading of the electric signal, though no problem is encountered in a low-frequency range of 100 MHz or less or in dc operation.

When the principal portions of the first and second surfaces 37 and 38 of the substrate 5 for semiconductor device are formed of the metal plate layers each having a uniform thickness as shown in FIG. 7, a stress resulting from a temperature increase during solder mounting is likely to be placed thereon. When the semiconductor element is fastened to the metal plate layer or the like by using an adhesive agent or the like, delamination occasionally occurs at the interface between the mold resin covering the semiconductor element and the metal plate layer due to the stress resulting from the temperature increase during solder mounting. When such delamination or the like occurs, moisture or the like is likely to reach the semiconductor element as a result of time-varying changes so that the reliability of the semiconductor device 10 is significantly degraded.

Figure 8A:
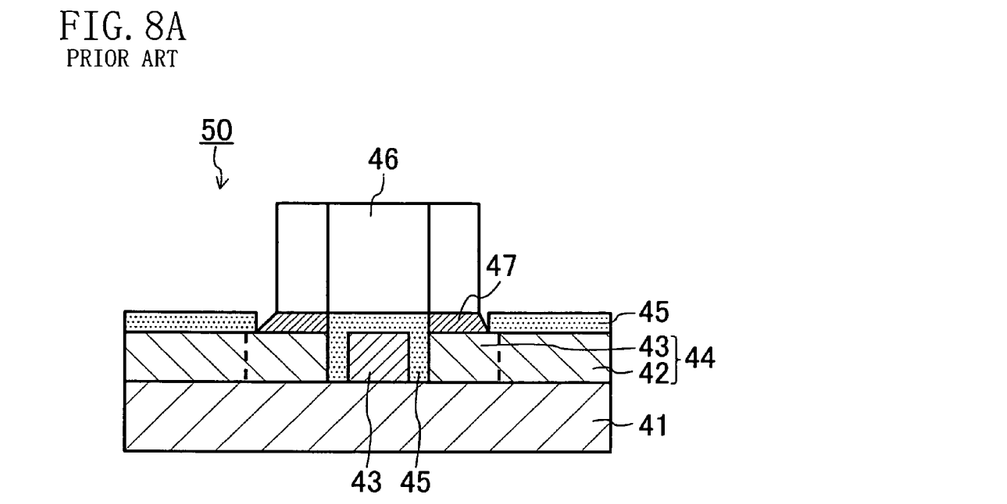
FIGS. 8A and 8B are schematic structural views each showing the state of the mounting of the conventional semiconductor device and a circuit component thereof.
Figure 8B:
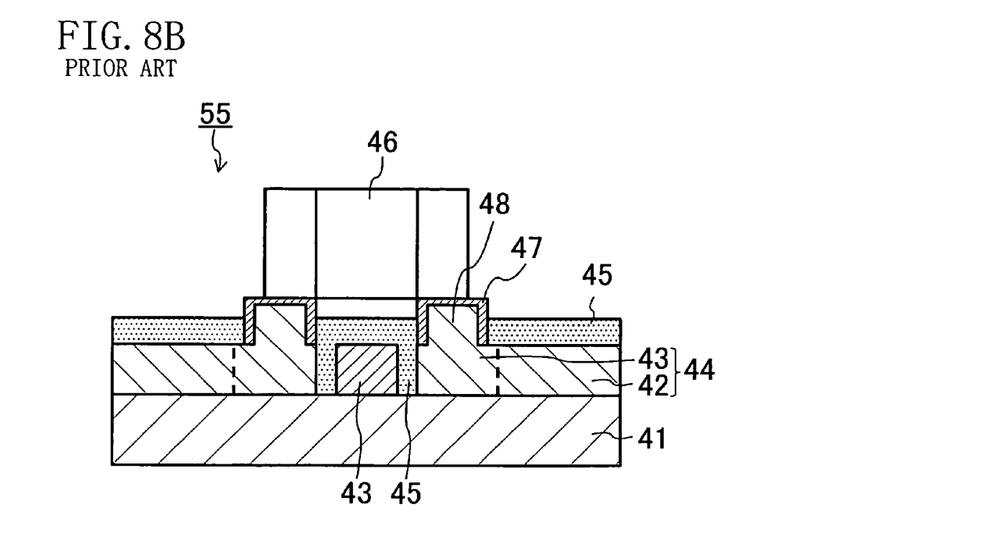

FIGS. 8A and 8B show an example obtained by modifying the structure of electrodes on the mounting circuit board shown in a prior patent document (Japanese Laid-Open Patent Publication No. 2005-32931). FIG. 8A schematically shows a circuit component 46 mounted on a conventional mounting circuit board 50. In the mounting circuit board 50, a circuit wiring portion 42 and a conductor 44 made of a land 43 are fastened onto an insulating substrate 41. An insulating resin 45 is formed on the insulating substrate 41 to cover the conductor 44 for preventing the solder from flowing out and providing insulation between the conductors 44. The insulating resin 45 on the land 43 has an opening formed therein. The land 43 is partially exposed through the opening and connected to the circuit component 46 by a solder connection portion 47.

In the mounting circuit board 50, however, the upper surface of the land 43 is depressed to a lower level by the thickness of the insulating resin 45. When the circuit component 46 is mounted by soldering on the land 43 of the mounting circuit board 50, the quality of the state of the solder connection portion 47 is determined by the amount of the solder. That is, when the solder is coated in a large amount in excess of the layer thickness of the insulating resin 45, the excessive solder causes the formation of a solder ball which does not contribute to connection or the flowing out of the solder so that a short circuit occurs between the adjacent conductors 44. Conversely, when the solder is coated in a small amount, a solder skip or the like occurs in the solder connection portion 47 to cause the problem of faulty connection between the electrode portion of the circuit component 46 and the land 43.

To solve the problem, a mounting circuit board 55 having a structure in which the land 43 connected to the circuit component 46 is protruding higher and thicker than the insulating resin 45 is used, as shown in FIG. 8B. The protruding portion 48 ensures reliable connection to the circuit component 46 and allows the remaining excess portion of the solder to escape between the protruding portion and the insulating resin. The arrangement allows the setting of the amount of the solder such that it is slightly larger than required to connect the protruding portion of the land 43 and the solder connection portion of the circuit component 46 within a given range. As a result, the state of the solder connection is surely improved compared with the state shown in FIG. 8A. It is to be noted that the prior patent document shows the case where a 2-terminal circuit component is mounted. In the case of mounting a semiconductor element typically having the 2-digit number of electrode terminals or more and having a high-frequency circuit integrated therein, an extra modification should be made.

In FIG. 8B, a solder ball or an extruded solder portion may be formed between the protruding portions 48 or on the outer side of the insulating resin 45 on which the mounted circuit component 46 is mounted. When such a solder ball or an extruded solder portion is formed on the mounting circuit board to which a high-frequency signal is transmitted, the high-frequency characteristics may be degraded, as mentioned above in the description of FIG. 7.

In summary, it can be said that, to solve the problems shown above, the prior patent document has modified the structure of the electrode such that the height of the electrode is larger than the height of the solder resist, thereby suppressing a short circuit between the adjacent electrodes and faulty bonding between the conductor and the terminal of the component or the like (see, e.g., Japanese Laid-Open Patent Publication No. 2005-32931). Otherwise, the region to which the remaining excess portion of the solder in the solder bonding portion is allowed to escape is formed in the board so that a short circuit or faulty bonding is suppressed (see, e.g., Japanese Laid-Open Utility Model Publication No. 04-87673 and Japanese Laid-Open Patent Publication No. 05-327196)

SUMMARY OF THE INVENTION

However, with regard to the mounting of a circuit component such as a chip component, each of the prior patent documents shows only an improvement made to the mounting circuit board on which the circuit component is mounted. In addition, the mounting of the circuit component is limited to the case where the number of electrode terminals is only two or several. None of the prior patent documents discloses a structure which typically has the 2-digit number of electrode terminals and a semiconductor bare chip mounted thereon, such as a semiconductor device. Moreover, in the case where the semiconductor device processes a high-frequency signal, the positions and configurations of the electrode terminals exert delicate and subtle effects on the high-frequency characteristics thereof. Therefore, without any modification, the approaches disclosed in the prior patent documents cannot be applied directly to the improvement of the electrode structure of the package of the semiconductor device.

As also mentioned above in the description of the conventional structure of the mounting of the semiconductor device, the solder portions 23 and 24 extruded from the mounting land 3 on the semiconductor substrate 1 and from the external terminal 14 are formed in the conventional electrode structure. Therefore, to obtain excellent high-frequency characteristics including low loss and low noise in processing a high-frequency signal, sufficient measures have not been taken against the extruded solder portions 23 and 25. To obtain such excellent high-frequency characteristics, it is necessary to devise an electrode structure in which the solder portions 23 and 24 mentioned above are not formed.

When the principal portions of the first and second surfaces 37 and 38 of the substrate 5 for the semiconductor device 10 are formed of metal plate layers each having a uniform thickness, a stress resulting from a temperature increase during solder mounting is likely to be placed thereon or may otherwise cause delamination at the interface between the resin covering the semiconductor element and the metal plate layer. When such delamination or the like occurs, moisture or the like is likely to reach the semiconductor element as a result of time-varying changes. As a result, the problem of the significant degradation of the reliability of the semiconductor device 10 occurs.

An object of the present invention is to solve the conventional problems shown above and thereby provide a semiconductor device having high reliability and also having high-frequency characteristics which are not degraded by a mounting process such solder connection and an electronic apparatus comprising a mounting circuit board on which the semiconductor device is mounted.

To attain the object, a semiconductor device according to the present invention comprises a semiconductor element and a wiring board, the wiring board having: a substrate having metal patterns formed on both surfaces thereof; an upper electrode and an external terminal each protruding above the metal patterns; a penetrating electrode formed with a metal plate layer penetrating the substrate to provide a connection between the upper electrode and the external terminal; a first surface formed with a first insulating film covering at least the metal pattern except for a portion of the first surface corresponding to the upper electrode; and a second surface formed with a second insulating film covering at least the metal pattern except for a portion of the second surface except for the external terminal, wherein the semiconductor element is placed on the first surface of the wiring board and connected to the upper electrode and each of the upper electrode and the external terminal is formed with the metal plate layer and disposed such that a height of a surface of the upper electrode is larger than a height of a surface of the first insulating film and a height of a surface of the external terminal is larger than a height of a surface of the second insulating film.

Alternatively, the semiconductor element may be placed on the first insulating film and covered, together with the upper electrode, with a resin.

In this case, the external terminal may have a stepped portion.

The arrangement provides connection between the solder-connected surface of the external terminal and a mounting circuit board connected thereto by using a proper amount of the solder placed therebetween without the occurrence of a solder skip. The remaining excess portion of the solder fills a part of the stepped portion of the external terminal so that the solder is prevented from being extruded and high-frequency characteristics are further improved.

At this time, the upper and lower portions of the substrate have only the regions thereof corresponding to the upper electrode and the external terminal thickened by the presence of the metal plate layer, while the region thereof other than those corresponding to the electrodes, which constitute the principal portions of the substrate, is substantially as thin as the substrate. Therefore, when a temperature change occurs, a stress occurring in a range extended from the metal plate layer to the resin substrate can be minimized.

In addition, the semiconductor element is placed on the first insulating film via the adhesive agent so that it lies on the resin. The semiconductor element is placed not on the metal but on the resin so that it is surrounded by the resin and connected to the substrate made of a resin material. As a result, even when a temperature change occurs, delamination resulting from the different linear expansion coefficients does not occur between the semiconductor element and the resin material and high reliability can be provided, since the semiconductor element is surrounded and fixed by the resin material to which it is bonded.

Alternatively, the metal plate layer of the external terminal may have a stepped portion and the surface of the second insulating film may be positioned between two surfaces, which are the solder-connected principal surface of the external terminal and a surface of the stepped portion.

In the arrangement, even when the amount of the solder placed between the solder-connected surface of the external terminal and the mounting circuit board connected thereto is large, the surface of the second insulating film dams the solder placed between the two surfaces of the stepped portion and flowing out and allows efficient filling of the stepped portion with the solder. As a result, the solder is prevented from being extruded and high-frequency characteristics are further improved.

Alternatively, at least a part of the metal pattern covered with the first insulating film and the metal pattern covered with the second insulating film may be connected to a ground terminal.

The arrangement prevents noise containing a particularly large amount of high-frequency components or the like from being placed on the wiring, electrode, terminal, and the like to and by which individual electronic signals are transmitted and thereby allows the retention of a lower noise level.

An electronic apparatus according to the present invention may comprise a mounting circuit board to which the semiconductor device shown above is connected by using a solder.

Alternatively, in a connection portion in which the external terminal of the semiconductor device is connected by using the solder to the mounting circuit board, the stepped portion of the external terminal may be filled with the solder.

The arrangement allows the provision of solder connection between the semiconductor device and the mounting circuit board with excellent high-frequency characteristics and further allows the provision of an electronic apparatus showing excellent high-frequency characteristics by packaging the mounting circuit board in the electronic apparatus.

BRIEF DESCRIPTION OF THE DRAWINGS

FIGS. 1A and 1B are schematic structural views each showing a semiconductor device according to a first embodiment of the present invention, of which

DETAILED DESCRIPTION OF THE PREFERRED EMBODIMENTS

Referring to the drawings, semiconductor devices according to the embodiments of the present invention will be described herein below. There are cases where the description of components denoted by the same reference numerals in the drawings is omitted. For clarity of illustration, the drawings primarily show the schematic representation of individual components and the configurations and the like thereof are not depicted precisely.

Embodiment 1

Figure 1A:
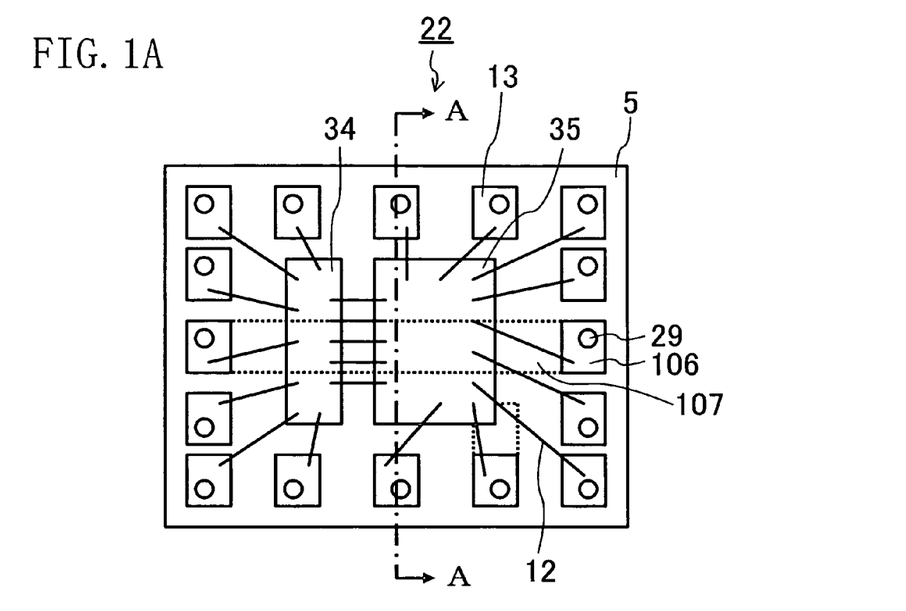
FIG. 1A is a schematic structural view showing a surface on which a semiconductor element is mounted and FIG. 1B is a cross-sectional view taken along the line A-A of FIG. 1A.
Figure 1B:
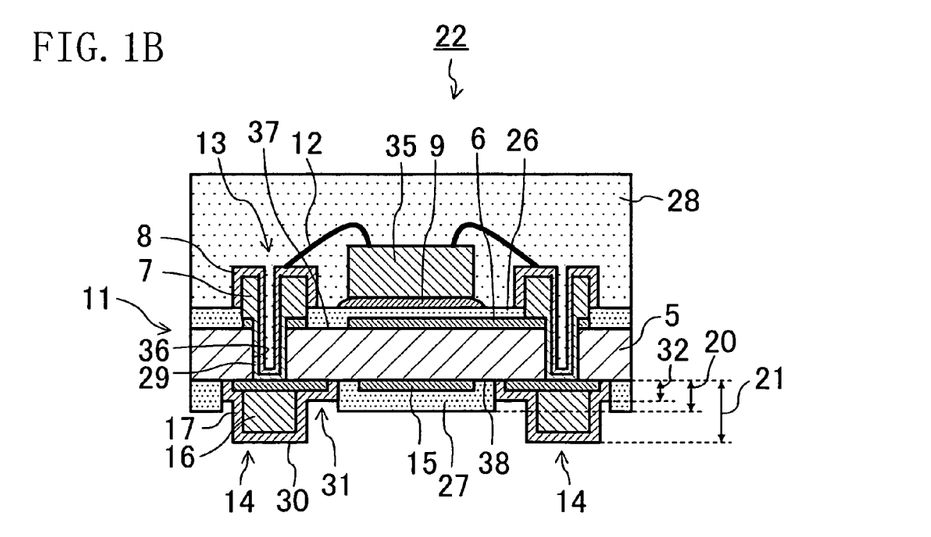

FIGS. 1A and 1B are views each showing the first embodiment of the present invention. FIG. 1A is a schematic structural view showing a surface on which semiconductor elements are mounted in a semiconductor device 22 according to the present embodiment. FIG. 1B is a cross-sectional view taken along the line A-A of FIG. 1A. FIG. 1A shows a state in which a mold resin portion 28 corresponding to a package upper portion has been removed for easy recognition of the positions of upper electrodes and the semiconductor elements.

In FIG. 1A, the semiconductor device 22 according to the present embodiment has a structure in which two semiconductor elements 34 and 35 are mounted on a first insulating film 26 on a substrate 5 for semiconductor device as a part of a package. In the vicinity of the four edges of the substrate 5 for semiconductor device, upper electrodes 13 are arranged along the individual edges and connected by conductive wires 12 to the semiconductor elements 34 and 35. The upper electrodes 13 are connected to external terminals 14 (not shown) on the lower portion of the substrate 5 for semiconductor device by penetrating electrodes 29. A part of the upper electrodes 13 serves as, e.g., a ground terminal 106 which provides connection between a metal pattern 6 insulated from the back surfaces of the semiconductor elements 34 and 35 by a first insulating film 26 and each of the ground terminals. The arrangement reduces a high-frequency coupling effect exerted by an electromagnetic field between individual electrode terminals or individual conductive wires to or by which a high-frequency signal is transmitted and thereby achieves reductions in a loss in high-frequency signal and in noise level.

A description will be given next to FIG. 1B obtained by taking the semiconductor device 22 along the line A-A of FIG. 1A. The semiconductor device 22 according to the present embodiment has a structure in which the semiconductor element 35 is mounted on the substrate 5 for semiconductor device as a part of a package lower portion 11 in such a manner that the semiconductor element 35 is adhesively fastened onto the first insulating film 26 by using an adhesive agent 9 such as, e.g., an Ag paste. The semiconductor element 35 is made of a GaAs-based material and a high-frequency circuit is integrated therein. The semiconductor element 35 is electrically connected to the upper electrodes 13 with the conductive wires 12 such as, e.g., Au wires. The upper electrodes 13 are electrically connected to the external terminals 14 via the penetrating electrodes 29 formed of metal plate layers 7 on the side surfaces of via holes 36 extending through the substrate 5 for semiconductor device. Each of the upper electrodes 13 has a structure in which, in consideration of bondability to the conductive wire, a surface metal plate layer 8 such as, e.g., a Ni/Au plate layer is further formed after the formation of the metal plate layer 7 such as, e.g., a Cu plate layer on the metal pattern 6 on the upper portion of the substrate 5 for semiconductor device. Specifically, the package lower portion 11 as a wiring board comprises: the substrate 5 for semiconductor device on which wiring is formed of a part of each of the metal patterns 6 and 15; the upper electrodes 13; the external terminals 14; the penetrating electrodes 29; and the first and second insulating films 26 and 27 covering the metal patterns 6 and 15, respectively.

For ensured reliability, the upper portion of the substrate 5 for semiconductor device is molded with a mold resin as an encapsulation resin and constitutes the upper portion of the package as the mold resin portion 28. Thus, the package lower portion 11 and the mold resin portion 28 serving as the package upper portion compose the package of the semiconductor element 35 as the main components.

The semiconductor element 35 is thus surrounded by the mold resin portion 28 made of the mold resin and the first insulating film 26 made of a resin material, while the resin of each of the mold resin portion 28 and the first insulating film 26 is connected to the substrate 5 for semiconductor device, which is made of a resin. In such a structure, even when a temperature change occurs, delamination or the like does not occur around the semiconductor element 35 since the semiconductor element 35 is surrounded only by the resins having substantially equal linear expansion coefficients and, moreover, the resins are solidly bonded to each other. When the semiconductor element 35 is fastened to the metal pattern 6 via the adhesive agent 9 as in the conventional structure, the difference between the respective linear expansion coefficients of the resin and the metal causes delamination at the interface between the resin and the metal.

On the other hand, the external terminals 14 each having the surface thereof positioned to have a height larger than a height 20 from a second surface (the lower surface in the drawing) 38 of the substrate 5 for semiconductor device to the surface of the second insulating film 27 are formed on the lower portion of the substrate 5 for semiconductor device. Each of the external terminals 14 is formed by laminating a surface metal plate layer 17, such as a Ni/Au plate layer, over the metal pattern 15 on the lower portion of the substrate 5 for semiconductor device and a metal plate layer 16 such as, e.g., a Cu plate layer. At this time, the surface of the metal plate layer on the lower surface of the substrate 5 for semiconductor device, except for the portions thereof corresponding to the external terminals 14, is covered with the second insulating film 27 as a solder resist and insulated thereby.

An example of the semiconductor device 22 thus constructed is an antenna switch module for a mobile telephone. In this case, the lengthwise, widthwise, and heightwise dimensions of the semiconductor device 22 are, e.g., 3.0× 3.0×0.6 mm so that a thin module is implemented. Each of the semiconductor elements 34 and 35 uses a MMIC using a material containing, e.g., GaAs, Si, SiGe, SiC, SiGeC, InP, GaInP, GaN, AlGaN, or the like as a main component and having a high-frequency circuit embedded therein.

As shown in FIG. 1B, each of the external terminals 14 is formed to have a protruding configuration having a stepped portion 31 for implementing solder mounting which allows retention of excellent high-frequency characteristics. A height 21 of a surface 30 of the protruding external terminal 14 from the second surface 38 of the substrate 5 for semiconductor device is 37.5 µm in an example of the present embodiment and larger than the height 20 of the surface of the second insulating film 27, which is 22.5 µm. At this time, the thickness of the substrate 5 for semiconductor device is 80 µm. Unlike on the substrate having the conventional structure shown in FIG. 7, the metal plate layer 16 made of Cu is not formed over the entire substrate 5 for semiconductor device. Accordingly, the thickness of the substrate 5 for semiconductor device of FIG. 7, including the metal plate layer 16, is generally uniform and is in the range of, e.g., 150 to 200 µm. In the present embodiment, by contrast, the thicknesses of the portions of the substrate 5 for semiconductor device corresponding to the upper electrodes 13 and the external terminals 14 are equally in the range of 150 to 200 µm, but the package lower portion 11 at the position at which the semiconductor element 35 is mounted is as small as 120 µm. In addition, the thickness of the metal material is also small because there is no metal plate layer under the semiconductor element 35. Therefore, even when a temperature change occurs, delamination does not occur since the semiconductor element is on the thin package lower portion 11 and does not undergo a stress resulting from a difference in thermal expansion coefficient between itself and the material to which it is bonded and high reliability can be achieved.

Figure 2:
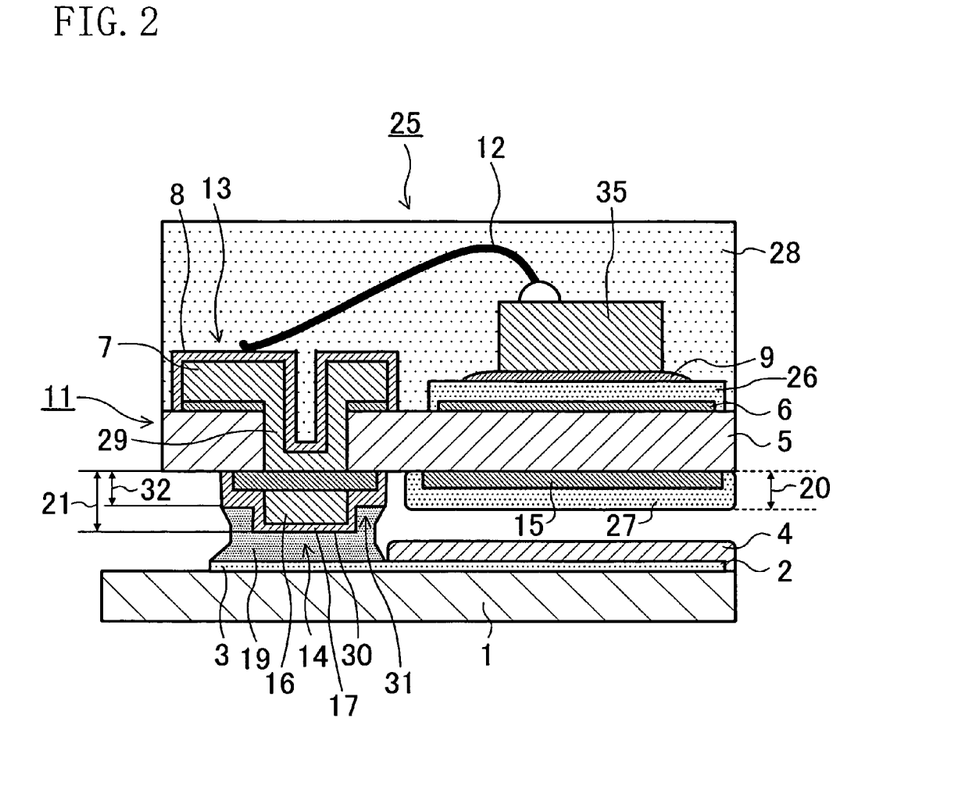
FIG. 2 is a principal-portion schematic structural view showing the semiconductor device according to the first embodiment and the state of the mounting thereof on a mounting circuit board.
Figure 3A:
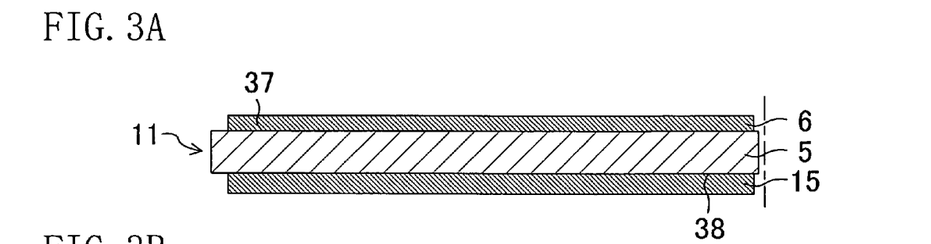
FIGS. 3A to 3E are views illustrating the process steps of fabricating a substrate for semiconductor device according to the first embodiment.
Figure 3B:
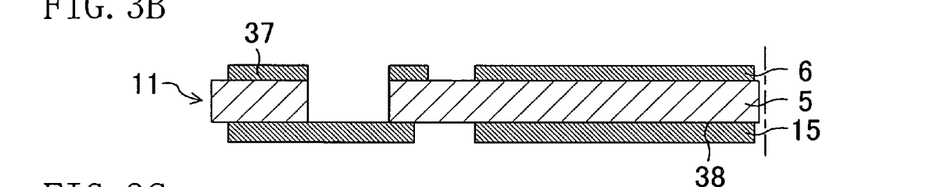
Figure 3C:
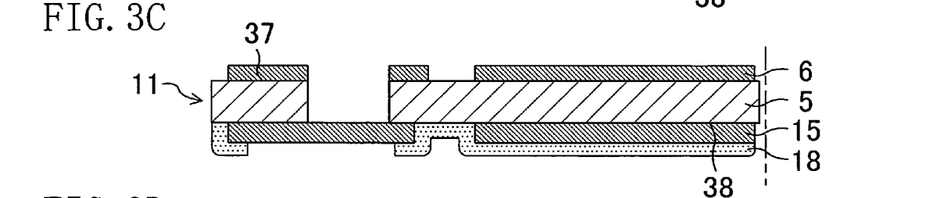
Figure 3D:
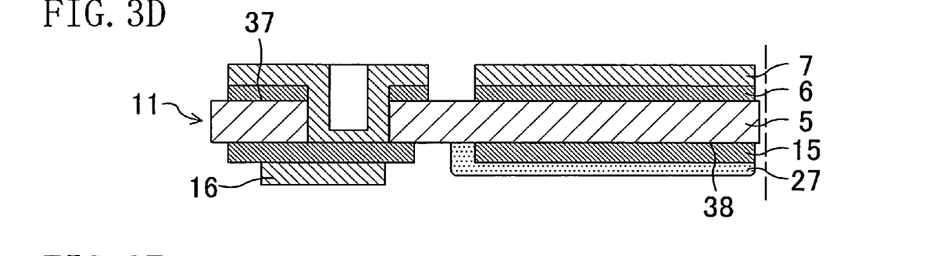
Figure 3E:
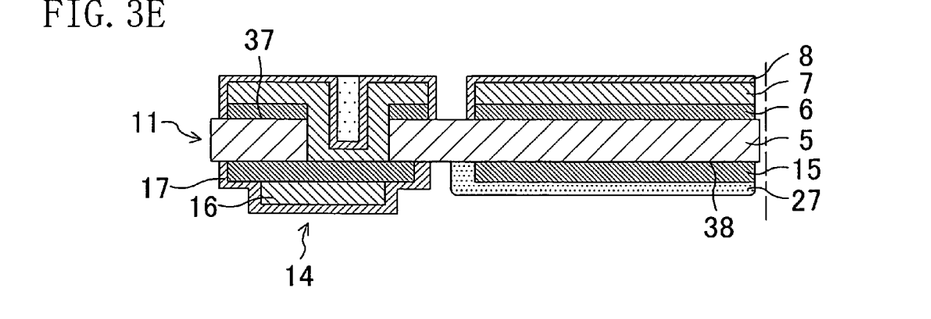

FIG. 2 shows a semiconductor device 25 which is substantially the same as the semiconductor device 22 shown in FIG. 1 and mounted by soldering on a mounting circuit board 1.

In FIG. 2, the semiconductor device 25 is mounted on the mounting circuit board 1 via a solder connection portion 19 by using a mounting land 3 and the external terminals 14. Since each of the external terminals 14 has a protruding configuration, it is in close proximity to the mounting land 3. Accordingly, bonding is achieved with a thin solder in the region corresponding to the solder connection portion 19. The mounting land 3 is continued to a wiring pattern 2 on the mounting circuit board 1.

Figure 6:
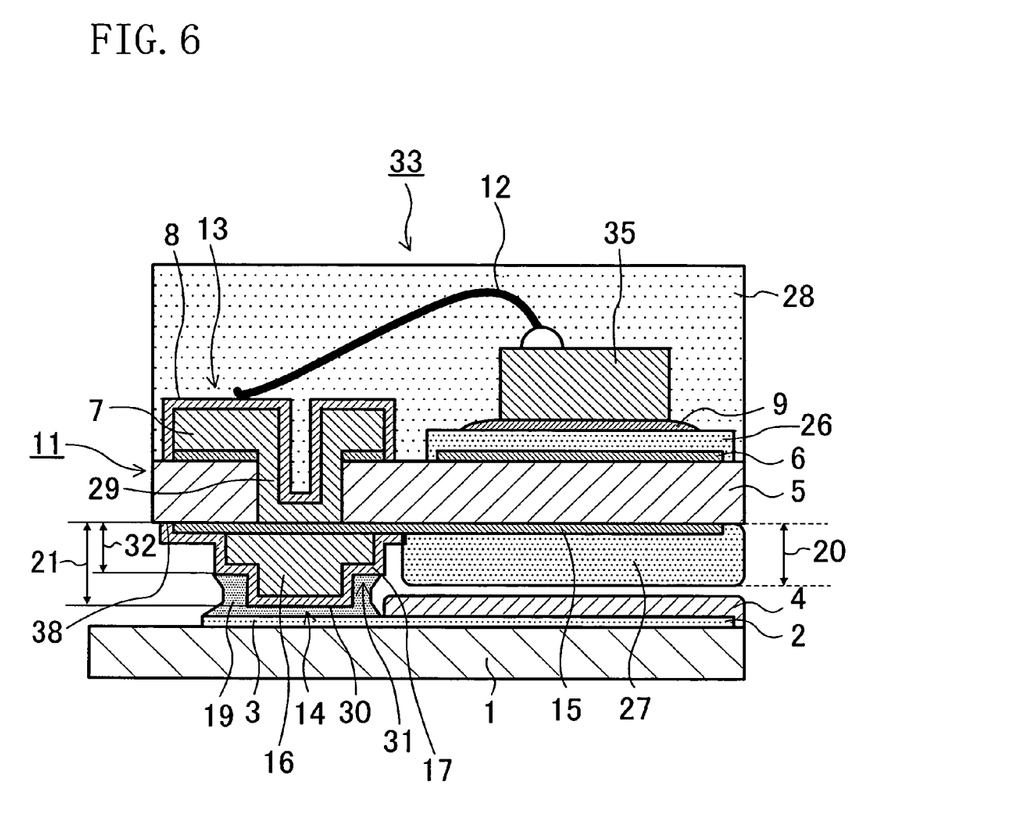
FIG. 6 is a principal-portion schematic structural view showing a semiconductor device according to a second embodiment according to the present invention and the state of the mounting thereof on the mounting circuit board.

Because each of the external terminals 14 has the stepped portion 31, the remaining excess portion of the solder used to connect the mounting land 3 to the external terminal 14 is allowed to escape to the expanded region interposed between the stepped portion 31 and the mounting land 3 and fill a part of the space thereof. Consequently, the configuration of the solder connection portion 19 is excellently stabilized in the form of a fillet as shown in FIG. 6. Therefore, a solder skip does not occur and the extrusion of the solder barely occurs.

As a result, a loss in electric signal was suppressed not only in the low-frequency range of 100 MHz or less and in dc operation but also in the RF range exceeding 500 MHz and the ground electrode disposed between the terminals suppressed crosstalk so that excellent high-frequency characteristics were observed during operation.

Table 1 shows the result of comparing the operating characteristics (average values when N=10 is satisfied) of the high-frequency circuit according to the present embodiment with those of the conventional embodiment.

TABLE 1

Comparison Table
Example of Operation Comparison between High-Frequency Circuits

|  | Power Loss | Crosstalk | Reliability Evaluation by Temperature Cycle Test |
|---|---|---|---|
| Present Embodiment | Good Reduction by 1 dB | Good Reduction by 2 dB | Excellent |
| Conventional Embodiment | Barely Acceptable | Barely Acceptable | Good |

Operating Frequency: 1.5 GHz
Operating Voltage: 3.3 V
N 32 10

Operating Frequency: 1.5 GHz
Operating Voltage: 3.3 V
N=10

As shown in Table 1, an improvement of 1 dB in the amount of loss and an improvement of 2 dB in crosstalk at an operating frequency of 1.5 GHz were observed. It is considered that the results are attributable to such factors as the provision of excellent solder connection, the suppression of coupling between high-frequency signals by using a ground pattern, and the formation of a structure in which the thickness of the package lower portion 11 is reduced except for the portions thereof corresponding to the upper electrodes 13 and the external terminals 14 such that a mechanical strength is prevented from being placed on the semiconductor element 35 during solder mounting or the like. The package lower portion 11 is designed to have a structure in which the respective amounts of protrusion of the upper electrodes 13 and the external terminals 14 protruding from the both surfaces thereof are substantially equal, the metal patterns occupying substantially equal areas are disposed on the both surfaces of the substrate 5 for semiconductor device, except for the regions thereof corresponding to these electrode portions, and the stress is prevented from being placed even in a heating step for solder mounting or the like. As a result, the mounting circuit board 1 is mounted by soldering without warping and has a structure on which a mechanical stress is not placed since the semiconductor element 35 is also fastened onto the first insulating film 26 by using an adhesive agent.

As a result of conducting 500 cycles of a temperature cycle test (−40° C. to +85° C.) for reliability evaluation, there was no delamination so that an excellent result was obtained.

FIGS. 4 and 5 show the outer configurations of the prototypes of the semiconductor devices 22 and 25 of which the high-frequency characteristics were thus recognized.

FIGS. 3A to 3E show the outline of the process steps of fabricating the substrate for semiconductor device according to the first embodiment.

First, a substrate (serving as the package lower portion 11) which is the substrate 5 made of a glass-epoxy material and provided with the double-side metal patterns 6 and 15 (each of which is made of Cu foil in the present embodiment and hereinafter referred to as Cu foil) is prepared. In the double-side Cu foil substrate, a non-penetrating hole reaching the back-side Cu foil is provided typically by using a laser. Briefly, only the Cu foil at the side opposite to the penetrated side is left. Then, the resist film 18 is formed on the portion intended to have a thin Cu wiring pattern after the completion. At this time, a photolithographic step is typically used. Thereafter, the metal plates 7 and 16 (each of which is a Cu plate in the present embodiment and hereinafter referred to as the Cu plate) each having a thickness of about 10 μm or more are formed typically by using an electrolytic plating method on the both surfaces of the substrate including the side surface of the non-penetrating hole provided previously so that the topside Cu foil and the back-side Cu foil are electrically connected to each other. At this time, since the Cu plate adheres to the portion other than that preliminarily formed with the resist film 18, the portion with the thicker Cu metal layer and the portion with the thinner Cu metal layer can be formed. After removing the resist, a typical patterning step (which is typically photolithography) is further performed and the second insulating film 27 as the solder resist is coated on the region of the thinner Cu foil portion which is not intended to be exposed. Finally, the surface metal plates 8 and 17 (Ni—Au double-layer plates) are deposited on the exposed Cu metal portions, whereby the substrate is completed. In this manner, the external terminals 14 each having the stepped portion can be formed.

Figure 4A:
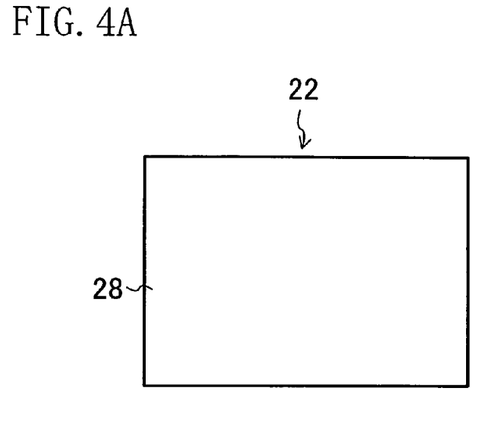
FIG. 4A is a top view of an outer configuration of a prototype of the semiconductor device according to the first embodiment.
Figure 4B:
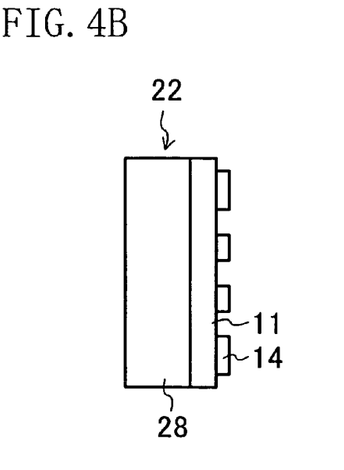
FIGS. 4B and 4C are side views thereof.
Figure 4C:
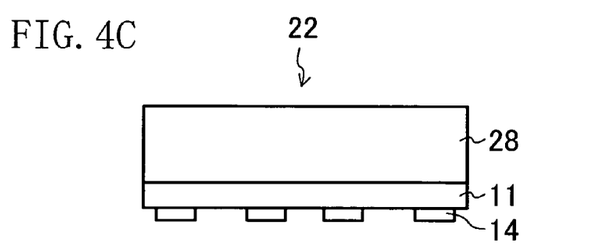
Figure 4D:
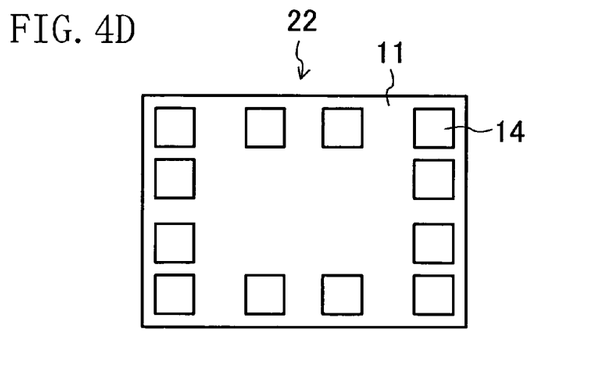
FIG. 4D is a bottom view thereof.

FIG. 4A is a view showing the top surface of the semiconductor device, FIG. 4B is a view showing a side surface thereof, FIG. 4C is a view showing the other side surface thereof, and FIG. 4D is a view showing the bottom surface thereof. By way of example, the outer configuration of the semiconductor device 22 is such that the lengthwise, widthwise, and heightwise dimensions thereof are 2.0×2.0×0.6 mm. For the mold resin portion 28 constituting the package upper portion, an epoxy resin, e.g., is used. For he substrate 5 for semiconductor device as the main component of the package lower portion 11, a BT resin as a resin material, e.g., may also be used instead of the glass-epoxy material. The metal plating of the external terminals 14 is primarily performed by using, e.g., Cu. For the metallization of the surfaces of the electrode terminals, Au plating, e.g., is performed.

Figure 5A:
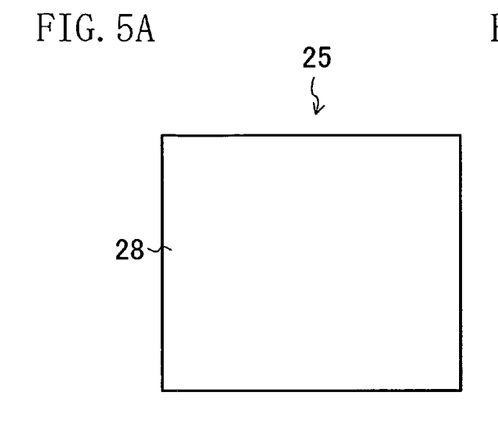
FIG. 5A is a top surface view of an outer configuration of another prototype of the semiconductor device according to the first embodiment.
Figure 5B:
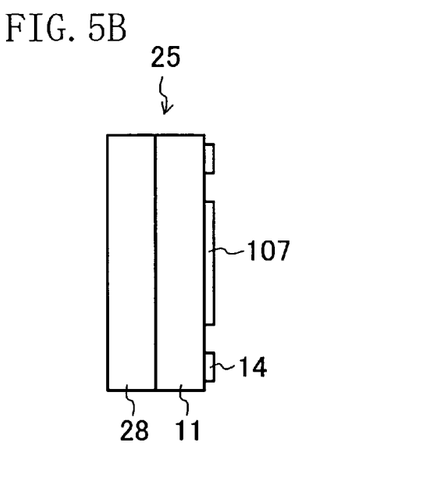
FIGS. 5B and 5C are side surface views thereof.
Figure 5C:
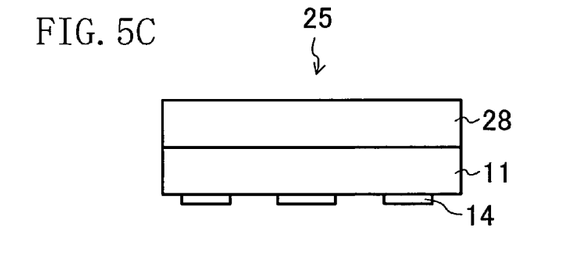
Figure 5D:
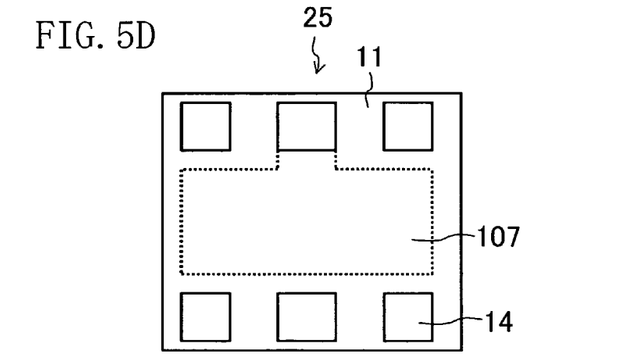
FIG. 5D is a bottom surface view thereof.

Likewise, FIG. 5A is a view showing the top surface of the semiconductor device 25, FIG. 5B is a view showing a side surface thereof, FIG. 5C is a view showing the other side surface thereof, and FIG. 5D is a view showing the bottom surface thereof. By way of example, the outer configuration of the semiconductor device 25 is such that the lengthwise, widthwise, and heightwise dimensions thereof are 4.0×4.0×1.2 mm. For the mold resin portion 28 constituting the package upper portion, an epoxy resin, e.g., is used. For the substrate 5 for semiconductor device as the main component of the package lower portion 11, a BT resin as a resin material, e.g., and the epoxy resin may also be used in combination instead of the glass-epoxy material. The metal plating of the external terminals 14 is primarily performed by using, e.g., Cu. For the metallization of the surface of the electrode terminals, electroless Au plating, e.g., is performed.

Embodiment 2

FIG. 6 is a view showing the second embodiment of the present invention. The second embodiment is different from the first embodiment of FIGS. 1A, 1B, and 2 in the configuration of the external terminal 14. Specifically, each of the external terminals 14 is configured such that the metal plate layer 16 has a stepped portion. The stepped configuration can be implemented by repeating the step of metal plating twice or by forming a thick metal plate layer and then removing a part thereof by etching or the like. As a result, when the second surface 38 of the substrate 5 for semiconductor device is used as a reference height, the height 20 of the second insulating film 27 is positioned between the height 21 to the surface 30 of the external terminal 14 and the height 32 of the stepped portion 31. A detailed description will be given herein below to the portions of the second embodiment which are different than in the first embodiment.

The external terminal 14 shown in FIG. 6 is formed to have a protruding configuration having the stepped portion 31 for implementing solder mounting which allows the retention of excellent high-frequency characteristics, similarly to that shown in FIG. 2. The height 21 of the surface 30 of the protruding external terminal 14 is larger than the height 20 of the surface of the second insulating film 27. In the structure according to the present invention, the height 20 of the surface of the second insulating film 27 is also larger than the height 32 of the stepped portion 31 of the protruding external terminal 14. The structure allows mounting on the mounting circuit board 1 such that the protruding external terminal 14 is connected to the mounting circuit board 1 via the solder connection portion 19. FIG. 6 shows the state of connection.

In FIG. 6, a semiconductor device 33 is mounted on the mounting circuit board 1 via the solder connection portion 19 by using the mounting land 3 on the mounting circuit board 1 and the external terminals 14. Since each of the external terminals 14 has a protruding configuration, it is in close proximity to the mounting land 3. Accordingly, the solder connection portion 19 has a compact area.

Because each of the external terminals 14 has the stepped portion 31, the remaining excess portion of the solder used to connect the mounting land 3 and the external terminal 14 is allowed to escape to the expanded region interposed between the stepped portion 31 and the mounting land 3 and fill the space thereof. Consequently, the configuration of the solder connection portion 19 is excellently stabilized in the form of a fillet as shown in FIG. 6. Therefore, a solder skip as shown in the conventional embodiment does not occur and the extrusion of the solder barely occurs. Since the height 20 of the second insulating film 27 is larger than the height 32 of the stepped portion 31, even when the amount of the solder is relatively increased, the solder in the solder connection portion 19 is dammed by the second insulating film 27 to efficiently fill the space of the region interposed between the stepped portion 31 and the mounting land 3. Hence, it is evident from FIG. 6 that the extrusion of the solder shown in the conventional embodiment barely occurs.

It was proved that, by inventively modifying the structure of the external terminals 14, the semiconductor device showed excellent high-frequency characteristics equal to those shown in Table 1 during operation without increasing the loss in electric signal not only in the low-frequency range of 100 MHz or less and in dc operation but also in the high-frequency range exceeding 500 MHz or without increasing the crosstalk level.

Although a GaAs-based material has been used in the semiconductor element having the high-frequency circuit integrated therein, another material such as Si, SiGe, SiC, SiGeC, InP, GaInP, GaN, AlGaN, or the like may also be used instead provided that the material allows the integration of the high-frequency circuit.

For the metal pattern, a conductive material such as Cu, Al, Au, or another metal (including an alloy) may be used appropriately.

Although Cu, Ni, Au, or the like has been used as the material for metal plating, another metal (including an alloy) may also be used instead.

Although the Ni—Au double-layer plate or the like has been used as the material for surface-layer metal plating, another metal material (including a Ni—Pd double-layer plate, a Ni—Pd—Au triple-layer plate, or another alloy) may also be used instead.

As a resin material used to compose the substrate or the insulating film, another material may also be used instead provided that it is appropriate as a material used for the mounting circuit board.

Thus, the present invention achieves the significant effect of providing the semiconductor device with excellent high-frequency characteristics including low loss and low crosstalk by inventively modifying the external terminals connected by soldering to the mounting circuit board and the peripheral structure thereof. The present invention also achieves the significant effect of providing the electronic apparatus comprising the mounting circuit board on which the semiconductor device is mounted with similarly excellent low-loss low-noise high-frequency properties. In addition, it is also possible to prevent defective mounting such as a short circuit in the step of solder-mounting the semiconductor device according to the present invention on the mounting circuit board of a mobile telephone or the like. Moreover, only the portions of the package of the semiconductor device corresponding to the electrodes are thick, while the substrate can be formed thin and the semiconductor element is surrounded by the resin material. As a result, even when a temperature change occurs, a stress resulting from the different linear expansion coefficients of the component materials is suppressed so that each of the semiconductor device according to the present invention and the electronic apparatus comprising the mounting circuit board on which the semiconductor device is mounted is allowed to have high reliability.

What is claimed is:

1. A semiconductor device comprising a semiconductor element and a wiring board, the wiring board having:
   a substrate having a first surface and a second surface opposite the first surface;
   a first metal pattern and a second metal pattern formed on the first surface and the second surface, respectively;
   an upper electrode formed on and protruding above the first metal pattern;
   an external terminal protruding above the second metal pattern;
   a penetrating electrode formed with a metal plate layer penetrating the substrate to provide a connection between the upper electrode and the external terminal;
   a first insulating film covering at least the first metal pattern except for a portion of the upper electrode; and
   a second insulating film covering at least the second metal pattern except for a portion of the external terminal, wherein the semiconductor element is placed over the first surface of the substrate and connected to the upper electrode the external terminal is disposed such that a height of a principal surface of the external terminal relative to the second surface is larger than a height of a surface of the second insulating film relative to the second surface, the external terminal comprises a first metal layer and a second metal layer covering the first metal layer and the second metal pattern, and forming a first stepped portion between the first metal layer and the second metal pattern, the second metal layer is in touch with the second metal pattern, and the second metal layer is in touch with the second surface forming a second stepped portion.

2. The semiconductor device of claim 1, wherein the semiconductor element is placed on the first insulating film and covered, together with the upper electrode, with a resin.

3. The semiconductor device of claim 1, wherein the external terminal has a stepped portion between the principal surface and the second surface, the principal surface of the external terminal, the surface of the second insulating film, and a surface of the stepped portion of the external terminal are substantially flat, are parallel to the second surface, and are disposed on the same side as the second surface with respect to the substrate.

4. The semiconductor device of claim 3, wherein the surface of the second insulating film is positioned between the principal surface of the external terminal and a surface of the stepped portion of the external terminal.

5. The semiconductor device of claim 1, wherein at least a part of the first metal pattern covered with the first insulating film and the second metal pattern covered with the second insulating film is connected to a ground terminal.

6. An electronic apparatus comprising a mounting circuit board to which the semiconductor device of claim 1 is connected by using a solder.

7. The electronic apparatus of claim 3, wherein, the electronic apparatus comprises a mounting circuit board, and in a connection portion in which the external terminal of the semiconductor device is connected by using the solder to the mounting circuit board, the stepped portion of the external terminal is partly or entirely filled with the solder.

* * * * *